(12) United States Patent
Dutartre et al.

(10) Patent No.: US 8,168,536 B2
(45) Date of Patent: May 1, 2012

(54) REALIZATION OF SELF-POSITIONED CONTACTS BY EPITAXY

(75) Inventors: Didier Dutartre, Meylan (FR); Philippe Coronel, Barraux (FR); Nicolas Loubet, Grenoble (FR)

(73) Assignee: STMicroeletronics S.A., Montrouge (FR)

( * ) Notice: Subject to any disclaimer, the term of this patent is extended or adjusted under 35 U.S.C. 154(b) by 412 days.

(21) Appl. No.: 12/101,744

(22) Filed: Apr. 11, 2008

(65) Prior Publication Data

US 2008/0254580 A1    Oct. 16, 2008

(30) Foreign Application Priority Data

Apr. 13, 2007   (FR) ...................................... 07 02696

(51) Int. Cl.
*H01L 21/44* (2006.01)
(52) U.S. Cl. .. 438/674; 257/288; 257/382; 257/E21.644
(58) Field of Classification Search .................. 257/288, 257/377, 382, E21.632, E21.644; 438/674, 438/624
See application file for complete search history.

(56) References Cited

U.S. PATENT DOCUMENTS

| | | | | |
|---|---|---|---|---|
| 6,072,221 A | * | 6/2000 | Hieda | 257/382 |
| 6,313,017 B1 | * | 11/2001 | Varhue | 438/503 |
| 6,548,875 B2 | * | 4/2003 | Nishiyama | 257/377 |
| 2005/0095799 A1 | | 5/2005 | Wang et al. | |
| 2007/0200179 A1 | * | 8/2007 | Chen | 257/369 |

OTHER PUBLICATIONS online definition given for SOG, spin on glass materials.*
Preliminary French Search Report, FR 07 02696, dated Nov. 12, 2007.

* cited by examiner

*Primary Examiner* — Matthew Landau
*Assistant Examiner* — Sonya McCall Shepard
(74) *Attorney, Agent, or Firm* — Gardere Wynne Sewell LLP

(57) ABSTRACT

Metal contacts are self-positioned on a wafer of semiconductor product. Respective placement areas for a metal contact are determined by a selective deposition of a growth material over a region of the substrate surface (for example, through epitaxial growth). The growth material is surrounded by an insulating material. The grown material is then removed to form a void in the insulating material which coincides with the desired location of the metal contact. This removal of the grown material exposes the region on the substrate surface. Conductive material is then deposited to fill the void and thus form the metal contact directly with the region of the substrate surface.

15 Claims, 4 Drawing Sheets

REALIZATION OF SELF-POSITIONED CONTACTS BY EPITAXY

PRIORITY CLAIM

The present application is a translation of and claims priority from French Patent Application No. 07 02696 of the same title filed Apr. 13, 2007, the disclosure of which is hereby incorporated by reference to the maximum extent allowable by law.

BACKGROUND OF THE INVENTION

1. Technical Field of the Invention

The present invention relates to the realization of electrical contacts in microelectronics, for example, during the fabrication of an integrated circuit.

2. Description of Related Art

A contact is defined as the entire volume of a pad serving as the connection point. This pad or contact is often composed of a conductive metal such as TiN, W or Cu.

The electrical contact is established at the interface between the contact pad and a contact zone, for example a silicided semiconducting zone of the active zones of a transistor. The surface of the pad actually in contact with the corresponding contact zone is called the "contact surface."

In the case of a Metal-Oxide-Semiconductor (MOS), the contact zones can be Source (S), Drain (D) or Gate (G) zones.

In the realization of an integrated circuit, contacts are realized for connecting active devices to the connecting lines. It is known to implement electrical contacts by first depositing a layer of a dielectric material and then using a photolithographic process. The contact placement areas are therefore determined by a masking operation. An anisotropic etching operation is performed to eliminate the dielectric material at the areas not masked by resin in the photolithographic step, so as to expose the areas where the future contacts will be placed.

However, the alignment of the resin mask relative to the underlying levels occurs with a certain overlay, such that the contact placements are also relatively imprecise and therefore imperfectly aligned with the control Gate (G). In the current race towards component miniaturization, alignment limits are becoming more and more restrictive, and there is the fear of short circuits resulting from such imprecision.

There is a need in the art to solve these disadvantages.

SUMMARY OF THE INVENTION

Techniques disclosed herein realize self-positioned metal contacts directly on a wafer of semiconductor product, with the respective placement areas of the metal contacts being determined by a step of selective deposition of a growth material.

The step of selective deposition, for example by epitaxy, raises the topography of the contact zones of the wafer. This self-aligned realization thus avoids the inaccuracies related to the masking operation, and therefore any short circuits.

Due to the relative absence of overlay between the contact surfaces and the corresponding contact zones (for example, the Source and Drain zones of a transistor), the distances between contact zones can be reduced, which allows increasing the integration density.

In addition, the access resistance for a contact is inversely proportional to the contact surface the electrons travel across. In the prior art, the access resistances can have relatively high values due to the overlay between contacts and contact zones (for example, Source and Drain zones). The techniques disclosed herein minimize these relatively high access resistance values, because the contact zones and contact surfaces coincide.

The techniques disclosed herein further overcome other disadvantages related to photolithographic processes as well. In particular, the height/width ratio of the unmasked zones in the prior art tends to increase with miniaturization, and therefore etching the dielectric material at the unmasked locations is relatively delicate to perform. Also, the etching operation in the prior art, because of its anisotropic and therefore purely mechanical character, can damage the wafer in the Source and Drain zones. The techniques disclosed herein avoid such a relatively delicate etching operation, as well as the risk of deterioration of the wafer, using a process relatively simple to implement, associating, for example, sacrificial epitaxy and isotropic etching, as detailed below.

The selective deposition step can, for example, comprise a selective epitaxy step. Epitaxy is a process of growing a crystalline material on another crystalline material, with both materials having relatively similar crystal structures and lattice sizes.

This is not limited by the selective deposition process used. One can, for example, deposit the growth material using a chemical vapor deposition (CVD) process, with temperature and pressure conditions such that the deposition occurs selectively.

"Semiconductor product" is understood to mean a microelectronic product comprising a substrate. The substrate is conventionally realized of doped single-crystal silicon, but can also be realized of other materials. For example, it is possible to use a FD-SOI (Fully Depleted Silicon On Insulator) substrate, or a flexible substrate.

If the growth material is conductive, the selective epitaxy step can lead directly to metal contacts: the metal contacts are then constituted of the growth material.

Alternatively, it is advantageous if the process comprises a step of selective deposition of the growth material, and additionally comprises steps of: a) depositing a dielectric material, which may or may not be for planarization, b) smoothing, such that the growth material is level with the surface, for example by performing a polishing operation, c) selectively removing the growth material, and d) depositing a conductive material to fill in the voids left by the removal.

The step c) of selectively removing the growth material exposes the contact zones of the wafer, such that the step d) of depositing a conductive material leads to the formation of metal contacts.

The conductive material can, for example, be of copper, or a TiN/W stack, a silicide, or a highly doped semiconductor material.

This process can be implemented by using a growth material for which the epitaxy is relatively well-controlled and understood, for example pure silicon, silicon-germanium ($Si_{1-x}Ge_x$, where x is between zero and one), or $Si_{1-x}C_x$, where x is between zero and one. It is also possible to use all possible $Si_xGe_yC_z$ alloys. In particular, $Si_xGe_{1-x}$ materials present an etching selectivity to doped single-crystal silicon which is relatively high, a function of the Ge content in the alloy, and allows completing the selective removal step c) relatively easily.

The wafer can be realized with CMOS technology for example. Of course, the invention is not limited by the type of technology used: for example, the invention can be used in the context of NMOS, bipolar, or optoelectronic technology.

In an embodiment, a process comprises: epitaxially growing a material on a doped zone of a substrate; depositing a dielectric on the epitaxially grown material; polishing the dielectric to expose the epitaxially grown material; selectively removing the epitaxially grown material relative to the deposited dielectric to form a void which exposes the doped zone of the substrate; and filling the void with a conductive material to form a contact directly with the doped zone of the substrate.

In another embodiment, a process comprises: epitaxially growing a material on a doped source/drain zone of a substrate adjacent to a gate structure; depositing a dielectric on the epitaxially grown material and gate structure; polishing the dielectric to expose the epitaxially grown material and a top of the gate structure; selectively removing the epitaxially grown material relative to the deposited dielectric to form a void which exposes the doped source/drain zone of the substrate; and filling the void with a conductive material to form a contact directly with the doped source/drain zone of the substrate.

In an embodiment, a process comprises: selectively depositing of a sacrificial growth material over a region of a semiconductor wafer to which metal contact is desired; removing the sacrificial growth material to form a void coinciding with and exposing the region of the semiconductor wafer; filling the void with a metal material to realize self-positioned metal contacts directly with the region of the semiconductor wafer.

BRIEF DESCRIPTION OF THE DRAWINGS

Other features and advantages of the invention will become more clear upon reading the description which follows. This is purely illustrative and is to be read while referring to the attached drawings, in which.

DETAILED DESCRIPTION OF THE DRAWINGS

For reasons of clarity, the dimensions of the various elements represented in these FIGURES are not in proportion to their actual dimensions, and the dimensions and proportions represented may vary from one FIGURE to another for the same reason. FIGS. 1A to 3E are cross-sectional views of substantially flat wafer portions, considered in a plane perpendicular to the surface of the wafer. A substrate is placed in the lower part of each FIGURE, and the vector N indicates a direction perpendicular to the surface of the substrate, pointing towards the top of the FIGURES. The direction of the vector N is said to be vertical, and the directions normal to this vector are said to be horizontal. In what follows, the terms "on," "under," "below," "above," etc. are used in reference to the orientation of the vector N. Let it be clear that "on" is understood to mean either "directly on" or "indirectly on," meaning that a layer deposited "on" another layer can be completely separated from said other layer by at least one other third layer.

In addition, in the FIGURES, the same reference numbers are used to indicate the same or similar objects.

Figure 1A:
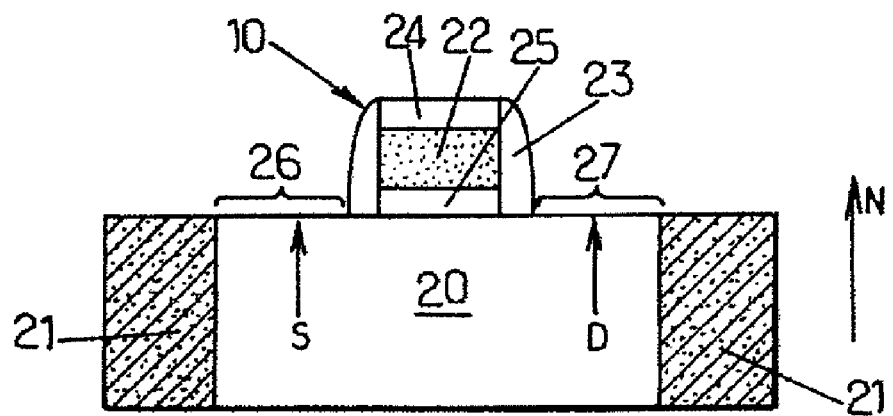
FIGS. 1A to 1E illustrate an example of a process according to one embodiment.

FIG. 1A shows an example of a portion of a wafer of semiconductor product before the metal contacts are put in place. The wafer portion represented corresponds to a CMOS transistor. The transistors are isolated from each other by shallow trench isolation (STI) regions 21, realized of silicon oxide for example.

The wafer comprises a region 20 of single-crystal semiconductor, for example of silicon or germanium, above which has been placed a gate region 10. The gate region 10 comprises the gate 22 itself, of polysilicon or metal for example, as well as an isolating region 25 of a dielectric material, for example an oxide, a hard mask region 24, also of a dielectric, and lateral spacers 23 of silicon nitride, for example.

The reference numbers 26, 27 correspond to the contact zones, which in this case are the source and drain zones of the transistor. These are doped single-crystal zones.

An epitaxy step is conducted in order to grow a growth material directly on these zones 26, 27.

Figure 1B:
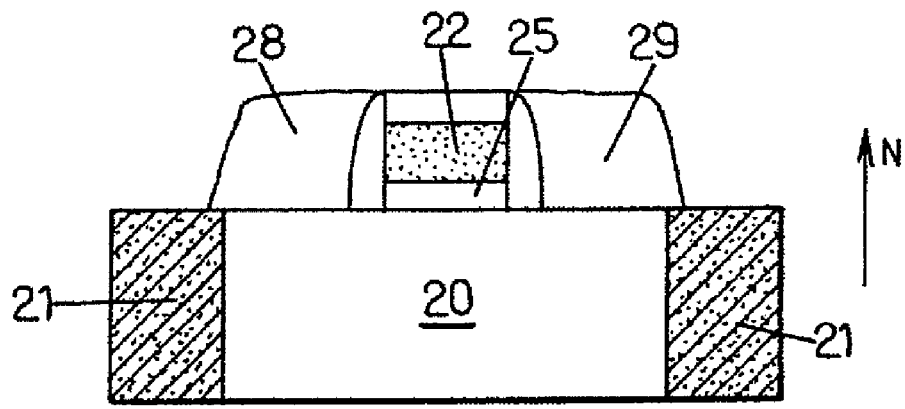

The epitaxy step can be realized using chemical vapor deposition (CVD) for example, liquid deposition, molecular jets, etc. As represented in FIG. 1B, this step results in the formation of regions of growth material 28, 29 located on the contact zones 26, 27.

The epitaxy step is realized under conditions (duration, pressure, temperature, etc.) such that the regions 28, 29 reach the hard mask of the gate 24, advantageously without excessive lateral overflow. In other words, it is advantageous to avoid having two regions of growth material join together above a gate region 10 or an STI isolation region 21.

The growth material can, for example, comprise or be constituted of silicon or of an alloy of silicon and germanium.

The epitaxy results in a growth of the growth material in the zone placement areas 26, 27.

In FIG. 1B, the deposited growth material is represented as slightly encroaching over the regions 21. This encroachment results from the fact that the crystal orientation of the substrate of the zones 26, 27 can lead to a horizontal growth phase of the deposited material. However, the encroachment remains relatively low, at most on the order of 15% of the thickness (vertically, or in the direction of the N vector) of the deposited growth material, and preferably less than 10% of this thickness.

For example, for a thickness of deposited growth material of about $500 \times 10^{-10}$ m (500 angstroms), the encroachment can be less than $50 \times 10^{-10}$ m (50 angstroms). It is advantageous if the encroachment is less than 5% of the thickness of the deposited growth material.

Also, for convenience in this description, the growth material is considered to be deposited in the zone placement areas 26, 27, and not on the isolation regions 21, and it is considered that the placement areas of the regions of growth material 28, 29 coincide with the zone placement areas 26, 27. "Coincide" is therefore understood to mean both "coincide exactly" and "mostly coincide," meaning that a range of about 15% of the thickness of the deposited growth material is tolerated.

The growth material is not deposited on the spacers 23, nor on the hard mask 24. In effect, these zones, as well as the regions 21, are constituted of SiN or $SiO_2$ dielectrics, and it is possible to adjust the deposition process so as to avoid growth on these surfaces, meaning that the epitaxy is selective. The placement areas of the regions of growth material 28, 29 coincide with the zone placement areas 26, 27. These placement areas define the locations of the future metal contacts.

Figure 1C:
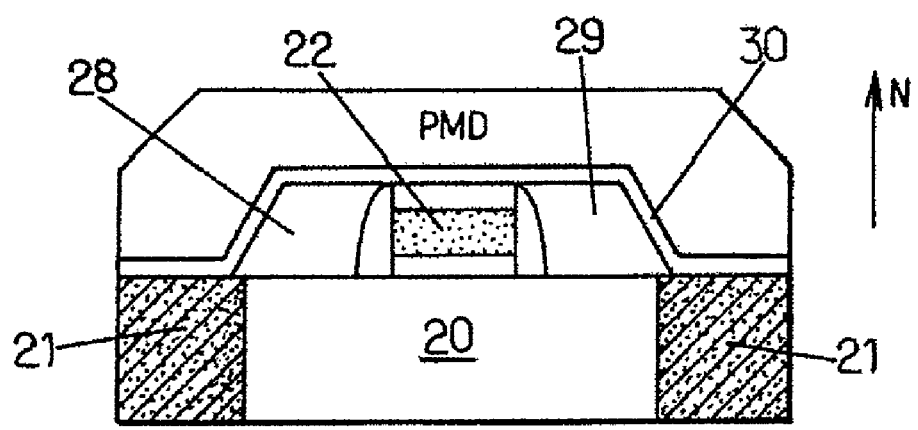

In this embodiment, a dielectric material is then deposited, as represented in FIG. 1C. After a smoothing step (see FIG. 1D) involving chemical mechanical polishing, a step of selectively removing the growth material is carried out (see FIG. 1E). This last step allows selectively uncovering the Source and Drain zone placement areas 26, 27, so that a metallization step results in the formation of contacts at the Source and Drain zone placement areas.

More specifically, in this example, first a thin film of nitride 30 is deposited, as represented in FIG. 1C. A PMD (pre-metal dielectric) deposition is then performed on a full wafer. An oxide, for example SiOC, can for example be used as the PMD material.

These depositions can, for example, be performed using CVD (chemical vapor deposition) or PECVD (plasma enhanced CVD) processes, or any other appropriate process.

Figure 1D:
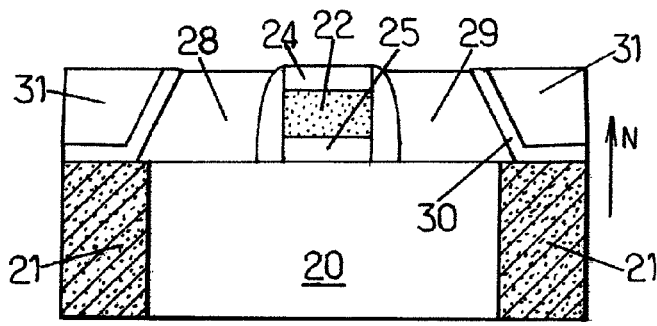

The smoothing step is performed such that the growth material is level with the surface, as represented in FIG. 1D. This step can, for example, comprise a chemical mechanical polishing (CMP) step, stopping at the hard mask for the gate 24.

The step of selectively removing the growth material can be performed by wet chemistry, gas chemistry using for example hydrogen chloride gas, plasma etching, etc.

Figure 1E:
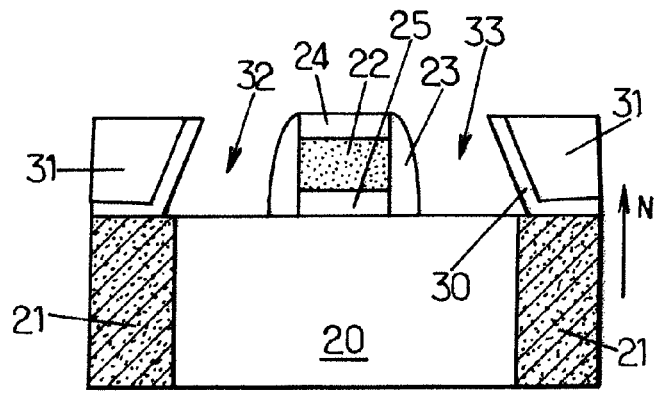

The removal is done selectively relative to the dielectric materials present on the wafer, such as the PMD 31 and the hard mask 24, but also relative to the substrates of the epitaxial growth, meaning the semiconductor of the region 20. This removal step leaves the contact placement areas 26, 27 exposed with a void 32, 33, as is represented in FIG. 1E.

Figure 2A:
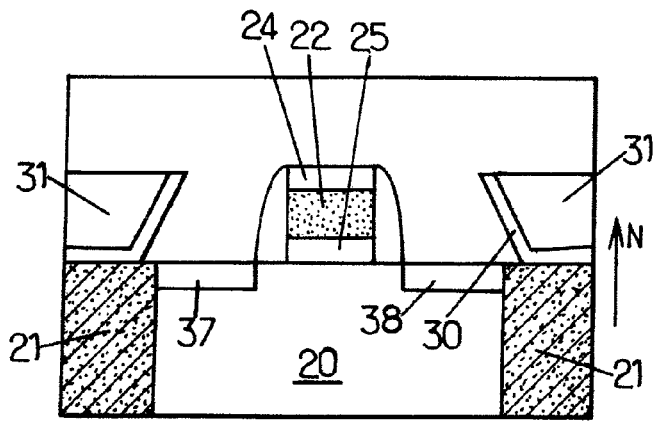
FIGS. 2A and 2B illustrate an example of a continuation of the process illustrated by FIGS. 1A to 1E.
Figure 2B:
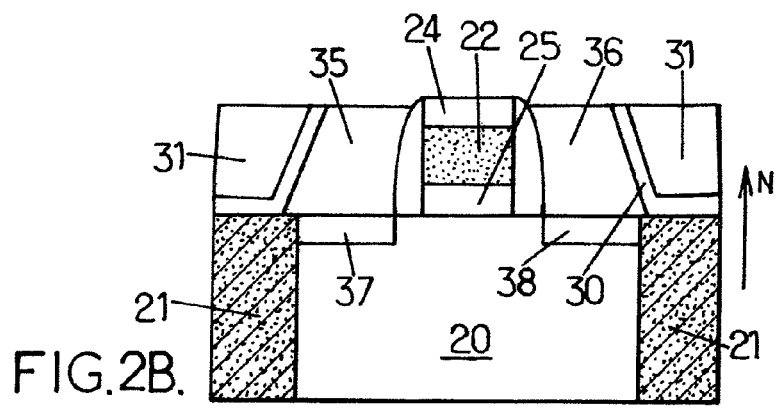

FIGS. 2A and 2B show an example of a continuation of this process. In this example, the gate 22 is metal, for example tungsten, TiN, TaN, etc. Silicidation of the Source and Drain zones 26, 27 is then performed. The silicidation allows decreasing the access resistance and therefore the transistor switching time.

The silicidation leads to the formation of silicided regions 37, 38 at the contact placement areas. The silicided regions can, for example, be of platinum silicide or erbium silicide. Platinum silicide, comprising $Pt_3Si$, $Pt_2Si$, PtSi molecules, can, for example, be obtained by supplying thermal energy using a process well known to a person skilled in the art.

Next, a metallization step is performed, as represented in FIG. 2A. A metal, for example, an alloy of titanium nitride and tungsten (TiN/W), is thus deposited in a manner which fills in the voids left by the removal step.

Next, a smoothing step is performed such that the metal is level with the surface, as represented in FIG. 2B. This step can, for example, comprise a CMP (chemical mechanical polishing) step which stops at the hard mask of the gate 24.

In this manner are formed the contacts 35, 36 located in the contact zones 26, 27, and without the overlay of the prior art.

FIGS. 3A to 3E show another example of the continuation of the process illustrated by FIGS. 1A to 1E. In this example, the gate is of polysilicon.

Figure 3A:
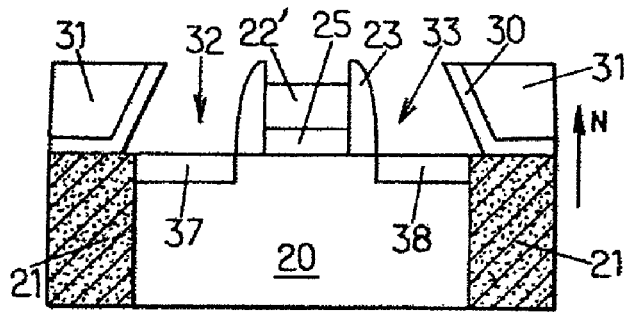
FIGS. 3A and 3E illustrate another example of a continuation of the process illustrated by FIGS. 1A to 1E.

The silicidation step is only performed after removal of the hard mask 24. This removal can for example be performed by wet chemistry. The gate, drain, and source are thus silicided, as is shown in FIG. 3A, in which the reference number 22' indicates the silicided gate.

Figure 3B:
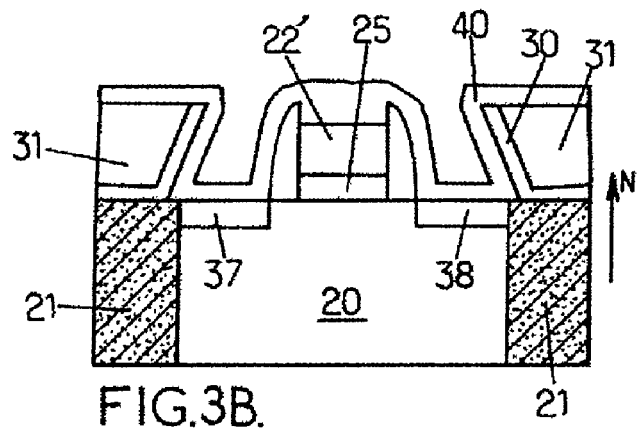

There is a risk that an immediate metallization step would result in a drain-gate or source-gate short circuit. To protect the gate 22', a layer of an insulating material 40 can be deposited (for example, a silicon dioxide ($SiO_2$) or a nitride), in a conformal manner as is represented in FIG. 3B. Due to the conformal deposition, the thickness of the silicon dioxide is greater at the top of the gate 22' than on flat surfaces (the "plug effect").

The deposition can, for example, be performed using a PEALD technology (Plasma Enhanced Atomic Layer Deposition).

Figure 3C:
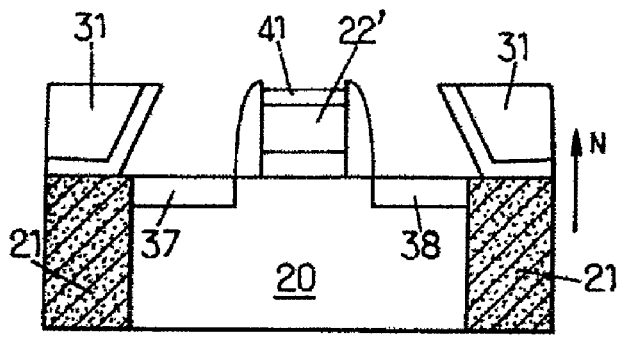
Figure 4:
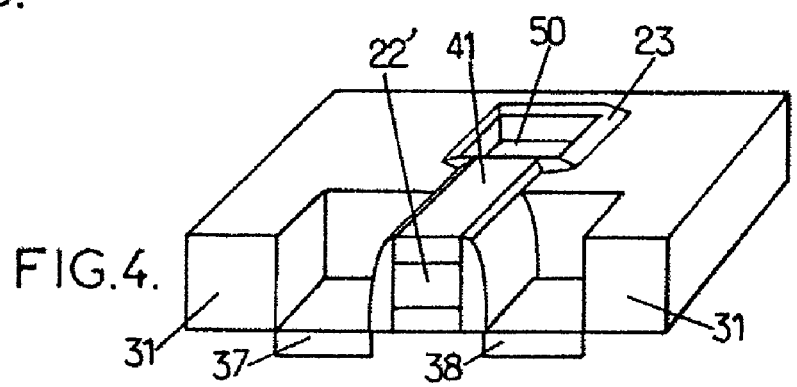
FIG. 4 is a perspective view of a wafer of semiconductor product during the process illustrated by FIGS. 3A to 3E.

Next comes a step which removes the insulating material, for example, by wet chemistry with hydrofluoric acid. The removal must be conducted under conditions such that the material of the layer is completely removed from flat surfaces, but not from asperities. In particular, the gate region 10 presents asperities such that it remains a region 41 of insulating material after the removal step, as represented in FIGS. 3C and 4. The silicided gate 22' is thus protected. However, the contact zone 50 corresponding to the gate is sufficiently flat for the insulating material to be eliminated from its surface.

FIG. 4 is a perspective view of a wafer of semiconductor product during the process illustrated by FIGS. 3A to 3E, and in particular at the step shown in FIG. 3C.

Figure 3D:
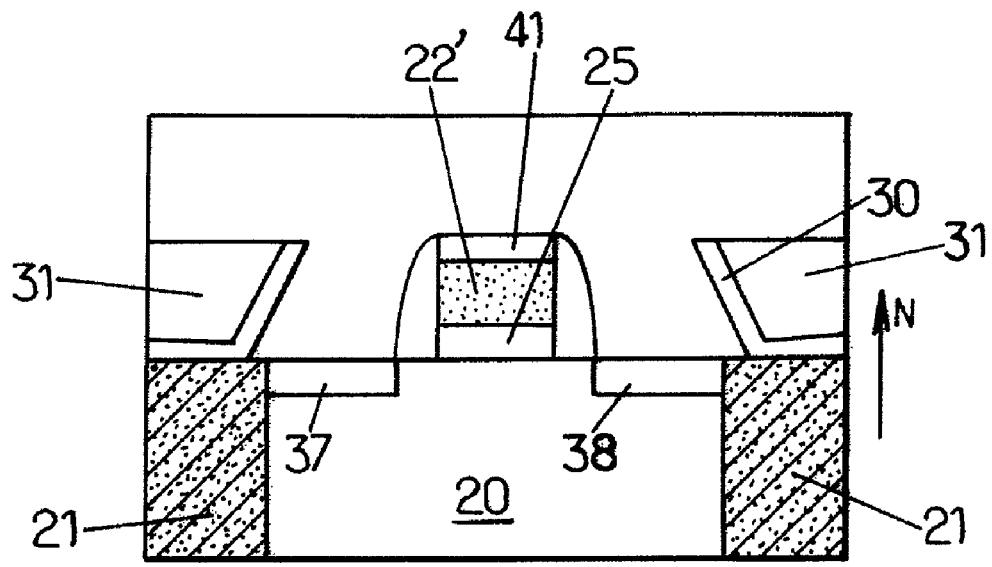
Figure 3E:
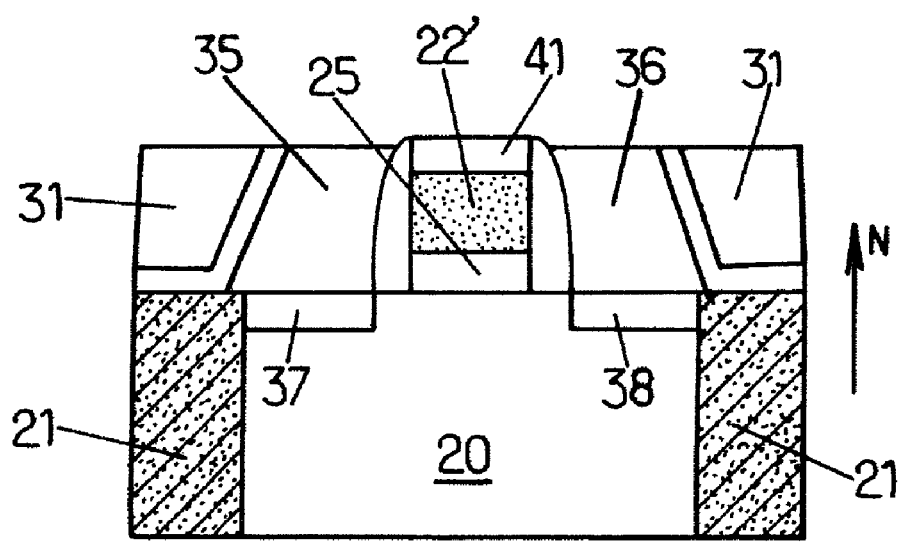

Metallization and smoothing steps are then performed, as represented in the respective FIGS. 3D and 3E. These steps allow obtaining contacts 35, 36 self-aligned with the contact zones 26, 27.

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process, comprising: realizing self-positioned metal contacts directly on a silicon wafer of semiconductor product wherein respective placement areas for the metal contacts are determined by selective deposition of a silicon-based sacrificial growth material on a surface of the silicon wafer followed by complete removal of the silicon-based sacrificial growth material at the placement areas for the metal contacts, the process comprising the steps of:
    a) depositing a dielectric material over the silicon-based sacrificial growth material,
    b) smoothing so as to partially remove the dielectric material and expose the silicon-based sacrificial growth material,
    c) selectively removing all of the silicon-based sacrificial growth material to open a void in the dielectric material which exposes the surface of the wafer,
    d) conformally depositing a layer of insulating material, after selectively removing c), the conformal layer of insulating material covering the surface of the silicon wafer in the void and a gate structure on the surface adjacent to the void,
    e) selectively removing the conformal layer of insulating material from the void while leaving the conformal layer of insulating material on the gate structure, and
    f) depositing a conductive material to fill any void left by the e) selective removing and thus form the self-positioned metal contacts directly on the wafer surface.

2. The process according to claim 1, wherein the wafer of semiconductor product is realized with CMOS technology.

3. The process according to claim 1, wherein selective deposition of the silicon-based sacrificial growth material comprises epitaxially growing the silicon-based sacrificial growth material on a surface of the wafer of semiconductor product at the placement areas for the metal contacts.

4. The process according to claim 1, wherein the placement areas for the metal contacts on the wafer of semiconductor product coincide with source/drain regions of a transistor formed in the wafer of semiconductor product.

5. A process comprising:
a) depositing a dielectric material over a silicon-based sacrificial growth material located at a placement area for a metal contact,
b) smoothing so as to partially remove the dielectric material and expose the silicon-based sacrificial growth material,
c) selectively removing all of the silicon-based sacrificial growth material to open a void in the dielectric material which exposes a surface of a wafer,
d) conformally depositing a layer of insulating material, after selectively removing c), the conformal layer of insulating material covering the surface of the silicon wafer in the void and a gate structure on the surface adjacent to the void,
e) selectively removing the conformal layer of insulating material from the void while leaving the conformal layer of insulating material on the gate structure, and
f) depositing a conductive material to fill any void left by the e) selective removing and thus form the metal contact directly on the wafer surface.

6. The process according to claim 5, further comprising forming a silicide region in the wafer coinciding with the void, the forming being performed prior to f) depositing the conductive material and after d) removal of the silicon-based sacrificial material to open the void.

7. The process according to claim 5, wherein the silicon-based sacrificial growth material is of the form $Si_xGe_{1-x}$, where x is between zero and one.

8. The process according to claim 5, wherein the silicon-based sacrificial growth material is of the form $Si_xC_{1-x}$, where x is between zero and one.

9. The process according to claim 5, wherein the silicon-based sacrificial growth material is of the form $Si_xGe_yC_{1-x-y}$, where the sum of x and y is between 0 and 1.

10. A process, comprising:
providing a transistor gate structure on a substrate, the gate structure including a hard mask covering a polysilicon gate material;
epitaxially growing a sacrificial material on a doped zone of the substrate adjacent the gate structure;
depositing a dielectric on the epitaxially grown sacrificial material;
polishing the dielectric to expose the epitaxially grown sacrificial material and the hard mask;
selectively removing all of the exposed epitaxially grown sacrificial material relative to the deposited dielectric to form a void which exposes the doped zone of the substrate;
removing the hard mask to expose the polysilicon gate material;
siliciding the exposed doped zone and the exposed polysilicon gate material;
conformally depositing a layer of insulating material which covers the silicided doped zone in the void and the silicided polysilicon gate material;
selectively removing the layer of insulating material from the void while leaving the insulating material covering the silicided polysilicon gate material; and
filling the void with a conductive material to form a contact directly with the silicided doped zone of the substrate.

11. The process of claim 10, wherein epitaxially growing is selective to the doped substrate and avoids growth on a dielectric material also on the substrate.

12. The process of claim 10 wherein the doped zone of the substrate is a source/drain region of the transistor.

13. The process of claim 11 wherein the doped zone of the substrate is a source/drain region of the transistor and the dielectric material also on the substrate is a spacer of that same transistor.

14. A process, comprising:
epitaxially growing a sacrificial material on a doped source or drain zone of a substrate adjacent to a gate structure;
depositing a dielectric on the epitaxially grown sacrificial material and gate structure;
polishing the dielectric to expose the epitaxially grown sacrificial material and a top of the gate structure;
removing a hard mask covering a gate material at the top of the gate structure;
selectively removing all of the exposed epitaxially grown sacrificial material relative to the deposited dielectric to form a void which exposes the doped source or drain zone of the substrate;
siliciding the exposed doped source or drain zone and the gate material;
conformally depositing a layer of insulating material which covers the silicided doped zone in the void and the silicided gate material;
selectively removing the layer of insulating material from the void while leaving the insulating material covering the silicided gate material; and
filling the void with a conductive material to form a contact directly with the doped source or drain zone of the substrate.

15. The process of claim 14, wherein epitaxially growing is selective to the doped substrate and avoids growth on a dielectric material associated with the gate structure.

* * * * *

UNITED STATES PATENT AND TRADEMARK OFFICE
CERTIFICATE OF CORRECTION

PATENT NO. : 8,168,536 B2
APPLICATION NO. : 12/101744
DATED : May 1, 2012
INVENTOR(S) : Didier Dutartre et al.

It is certified that error appears in the above-identified patent and that said Letters Patent is hereby corrected as shown below:

On the Title Page:

At paragraph (73), Assignee's name is misspelled. Please replace

[STMicroeletronics S.A.] with -- STMicroelectronics S.A. --.

Signed and Sealed this
Twenty-sixth Day of June, 2012

David J. Kappos
*Director of the United States Patent and Trademark Office*